(12) United States Patent
Shim (10) Patent No.: US 8,310,771 B2
(45) Date of Patent: Nov. 13, 2012

(54) LED LIGHT CONVERTING RESIN COMPOSITION AND LED MEMBER USING THE SAME

(76) Inventor: Hyun-Seop Shim, Seoul (KR)

( * ) Notice: Subject to any disclaimer, the term of this patent is extended or adjusted under 35 U.S.C. 154(b) by 65 days.

(21) Appl. No.: 12/824,657

(22) Filed: Jun. 28, 2010

(65) Prior Publication Data

US 2011/0317283 A1    Dec. 29, 2011

(51) Int. Cl.
*G02B 27/02* (2006.01)
*C09K 11/06* (2006.01)
*H01L 33/00* (2010.01)
*H01J 1/62* (2006.01)

(52) U.S. Cl. .................. 359/800; 252/301.16; 257/100; 313/512

(58) Field of Classification Search ................. 359/798, 359/800; 252/301.16; 257/79, 100; 313/512, 313/503
See application file for complete search history.

(56) References Cited

U.S. PATENT DOCUMENTS

2003/0080341 A1 * 5/2003 Sakano et al. .................. 257/79

* cited by examiner

*Primary Examiner* — William Choi
(74) *Attorney, Agent, or Firm* — Galgano & Associates, PLLC; Thomas M. Galgano; Jessica G. Bower (57) ABSTRACT

An LED light converting resin composition and an LED member using the same. The LED light converting resin composition having 20~99 wt % of transparent resin, 0.8~60 wt % of a lighting color converting fluorescent substance, and 0.2~20 wt % of a light diffusing bead with an average particle diameter of 0.2~30 μm.

15 Claims, 8 Drawing Sheets

PRIOR ART

FIG. 9C

PRIOR ART

PRIOR ART

LED LIGHT CONVERTING RESIN COMPOSITION AND LED MEMBER USING THE SAME

BACKGROUND OF THE INVENTION

1. Field of the Invention

The present invention relates to an LED (Light Emitting Diode) light converting resin composition, and an LED member using the same. More particularly, the present invention relates to a LED light converting resin composition obtained by mixing a heat-resistant transparent matrix resin with a color converting fluorescent substance, and a light diffusing bead, optionally together with a pigment, and an LED member using the same, such as an LED lens or a light guide plate.

2. Description of the Prior Art

An LED is a kind of semiconductor device which converts electrical energy to light energy by using a characteristic of a semiconductor including a specific compound. The LED is advantageous in that its power consumption is very small due to high photoconversion efficiency, it is appropriate for miniaturization, slimming, and light-weighting, due to its small size light source and at the same time can be unlimitedly extensibly provided, it has a semi-permanent and long life (a blue, violet, or UV LED has a life of about 100,000 hours, and a white LED has a life of about 30,000 hours), it has a very high response speed due to no need for pre-heating because it does not use thermoluminescence or electroluminescence, it has a very simple lighting circuit, it has high impact resistance, safety, and few environmental polluting factors because it does not use discharge gas and a filament, it can perform pulsed-operation with a high repetition rate, it reduces fatigue on an optic nerve, and it can realize full color. Accordingly, the LED is widely used for a light source for a liquid crystal display (LCD) back light of a cellular phone, a camcorder, a digital camera, a personal digital assistant terminal (PDA), etc., a traffic light, an electronic display board, a car headlight/taillight, a display lighting lamp of various kinds of electronic devices, office machines, a Fax, etc., a night lighting of a remote control or a surveillance camera, infrared communication, an information display of an outdoor advertising board using various combinations of RGB pixels, an ultra-precision display of an electronic display board, and high-class indoor/outdoor lighting. Especially, a high-brightness LED in which a general problem found in a conventional LED, such as a low brightness, has been improved, has been commercially available, and its purposes and applicable devices have been rapidly expanded.

Especially, since a white LED is very useful as a light source for an LCD back light, and an indoor/outdoor lighting, its usage frequency has been rapidly increased. Also, in like manner as an incandescent lamp shows a tendency to be driven out from a market by a fluorescent lamp, it is expected that the LED will sweep over a lighting market within a short period of time.

A method for obtaining a white light by an LED is described below.

First, there is a classical method for obtaining a white light by combining three LEDs of red, green, and blue. The method has a problem in that it requires a relatively high manufacturing cost, increases the size of a product due to a complicated operating circuit, and degrades an optical characteristic and reliability of the product due to a difference in the temperature characteristics of three LEDs, and thus is hardly used at present.

There has recently been another method for obtaining a white light, in which a white LED is selected as a single LED for generating a white light, the surface of the white LED is coated with a fluorescent substance or the white LED's peripheral or lens is molded by being mixed with a fluorescent substance, a light generated by the single LED with a specific wavelength excites the fluorescent substance to generate a light with another wavelength, and the generated light is mixed with the light generated by the single LED chip.

However, in such a conventional method, the surface of a blue, violet, or UV LED is directly coated with a fluorescent substance or the LED's peripheral or lens is molded by being mixed with a fluorescent substance. Thus, the method has a problem in that the life of the LED is significantly reduced to one third or less due to LED degradation caused by a reduction in heat dissipation. Especially, if the fluorescent substance is not very homogeneously coated or dispersed/distributed, the luminescent color becomes inhomogeneous. However, it is very difficult to achieve homogeneous coating or dispersion/distribution of the fluorescent substance.

U.S. Pat. No. 5,998,925 (Nichia Corp.) discloses a widely practically used and oldest-type white LED, in which an InGaN-based blue LED with a wavelength of 450 nm is coated or molded with a yellow fluorescent substance (in general, yttrium-aluminum-garnet:$Y_3Al_5O_{12}$:Ce, YAG-based compound), and a blue light of the blue LED excites the YAG yellow fluorescent substance. This allows the two wavelengths including the narrow-peak blue light of the blue LED, and the wide-peak yellow light of the YAG-based yellow fluorescent substance, to be recognized as a white light by human's eyes through complementary interference.

However, the white light includes mixed-lights having two wavelengths with incomplete complementarity, and thus has only a part of a visible region spectrum. For this reason, the white light has a color rendering index (CRI) of about 60~75, and is generally not recognized as a near-natural white light. Thus, it does not satisfy a general indoor lighting. Also, there is a problem in that the luminance is low because the blue LED shows the highest efficiency at an excitation light source of about 405 nm while the YAG-based fluorescent substance is excited by a blue light of 450~460 nm. Especially, in coating or molding of the YAG-based fluorescent substance, it is difficult to guarantee a homogeneous and uniform dispersibility. This reduces the uniformity and reproducibility of a product, and significantly reduces the life of an LED, in the luminance and spectral distribution of a white light.

In order to overcome the problems of the white LED including the blue LED and the YAG-based fluorescent substance, there has been suggested another-type of white LED. U.S. Pat. No. 5,952,681 (Solidlite Corp.) discloses a technology of obtaining a three-wavelength high-CRI near-natural white light by using a high-luminance UV LED with a wavelength of 250 nm~390 nm as an excitation light source, and combining red, green, and blue fluorescent substances. However, the utilization of the white LED has a problem in that the blue and green fluorescent substances show a satisfactory light-emitting efficiency while the red fluorescent substance shows a low light-emitting efficiency. Especially, in a case of the UV LED, an organic resin is deteriorated by UV with a strong energy, thereby significantly reducing the life of the LED.

There is another type of white LED (Solidlite), which uses a violet LED with a wavelength of 390 nm~410 nm, and obtains a white light by combining red, blue, and green fluorescent substances. The high-luminance violet LED is commercially available from Cree Corporation (U.S.), and is known to emit a relatively natural three-wavelength white light through uniform light-emission of red, blue, and green fluorescent substances by the violet light with 390~410 nm.

Factors having an influence on the characteristics of a white light emitted from a white LED element may include the intensity of the LED-emitted light, combination applicability of the light emitted from the LED and the light fluorescent-converted by a fluorescent substance, and the component, the content, and the dispersed state of the fluorescent substance. These factors have a significant influence on an emitted light. Especially, a white light emitted by the blue LED and the YAG-based fluorescent substance may have a problem in that the emitted color is generally inclined to blue or yellow due to the difficulty in the additive amount adjustment and the homogeneous dispersion of a yellow fluorescent substance.

In order to obtain a white LED having a high light-emitting characteristic, a fluorescent substance has to be homogeneously dispersed in a light-transmissive matrix resin. However, in a fabrication process, before the matrix resin is completely hardened, a fluorescent substance with a much higher specific gravity (specific gravity of about 3.8~6.0, but dependent on the kind of the fluorescent substance) is precipitated in the lower portion of light-transmissive matrix resin with a low specific gravity (e.g., an epoxy resin has a specific gravity of about 1.1~1.5). Thus, it is difficult to obtain a white light having a high light characteristic. Furthermore, it is not easy to precisely control a degree of dispersion of a fluorescent substance. Accordingly, there is a problem in that it is not easy to fabricate a high-quality white LED device, and the fabrication reproducibility is not good.

Meanwhile, an LED lighting device employs an LED lens so that the light diffused and emitted from the LED through voltage application can be a parallel beam, and the intensity of the radiation can be increased within a view angle. Also, the view angle is adjusted by controlling curvatures of a light-incidence lower surface of the lens, and a light-emission upper surface of the lens. Also, it may be appropriately selected and used from various shapes, and sizes of lenses according to various parameters, such as the kind and power of a used LED, the use purpose, the preference of an end user, and the required intensity of the lighting.

Figure 8:
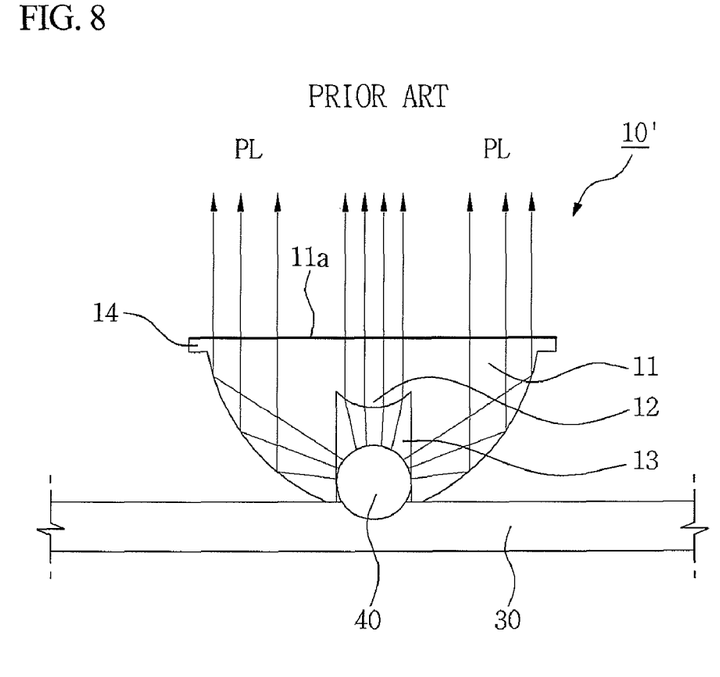
FIG. 8 is a sectional view of a conventional LED lens.
Figure 9A:
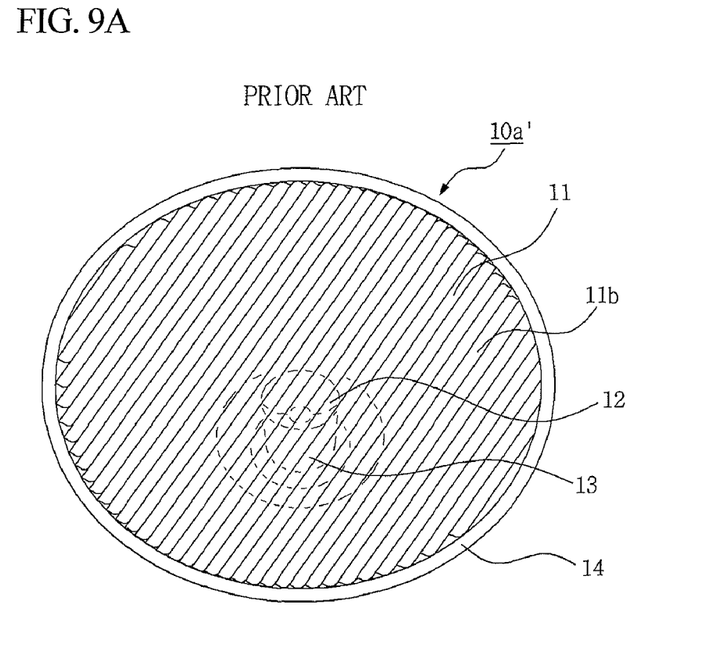
FIGS. 9a to 9c are photographs showing conventional various types of LED lenses, respectively.
Figure 9B:
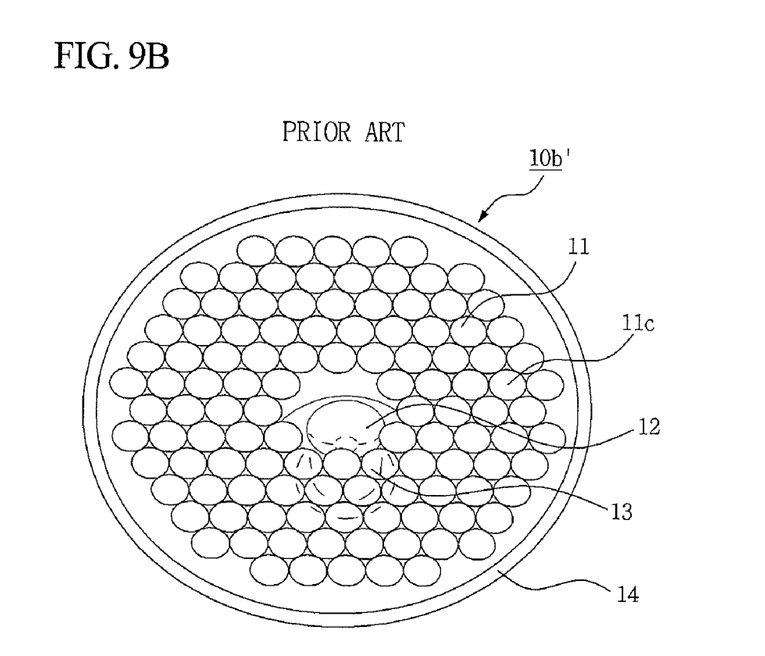
Figure 9C:
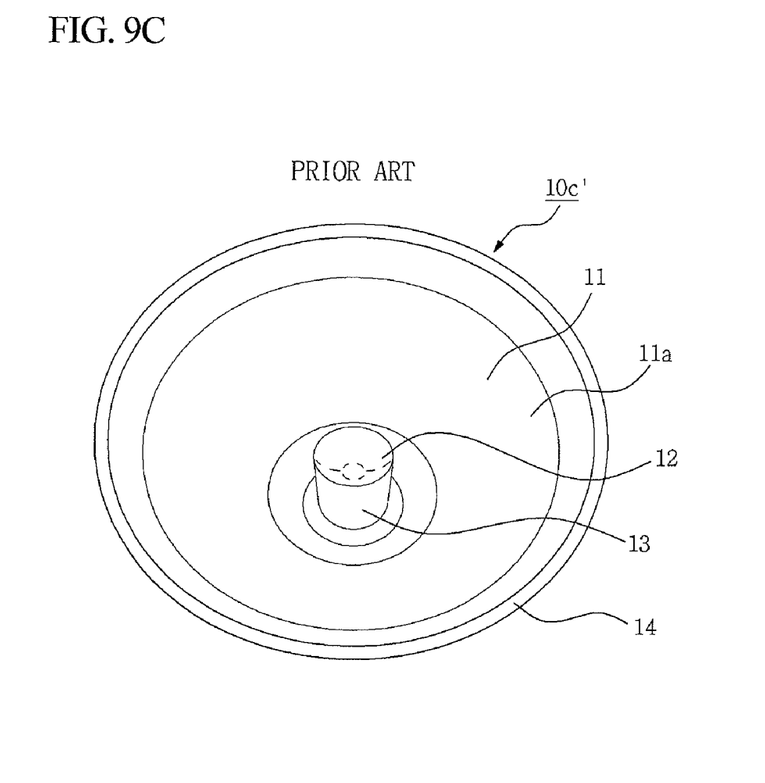

FIG. 8 shows a sectional view of a conventional LED lens and FIGS. 9a to 9c show photographs of conventional various types of LED lenses 10', 10a', 10b', and 10c', respectively. The conventional LED lenses 10a', 10b', and 10c' are generally hemisphere-shaped with a wide upper part and a narrow lower part, but are not limited thereto. They may take very various shapes. The lenses have upper surfaces 11a, 11b, and 11c formed with an annular lateral portion 11 and a flange 14, and a cylindrical LED mounting portion 13 formed at the bottom thereof. The upper portion of the LED mounting portion 13 may be formed into a flat shape, but is generally formed with an internal convex portion 12 for condensing.

The LED lenses 10', 10a', 10b', and 10c' may have a pectination upper surface 11a for making an emitted light to be mild, a multiple-dot type upper surface 11b, or a slippery smooth upper surface 11c. Also, the upper surface may have an opening at the center thereof, and the lateral portion 11 may have various angle-gradients and lengths for adjustment of an irradiation angle. Also, the upper surfaces 11a, 11b, and 11c may be formed into a forward-projecting convex shape, a flat shape, a concave shape, or another specific shape.

The reference numeral 30 denotes a substrate and the reference numeral 40 denotes a light diffusing lens for LED element molding.

Figure 10:
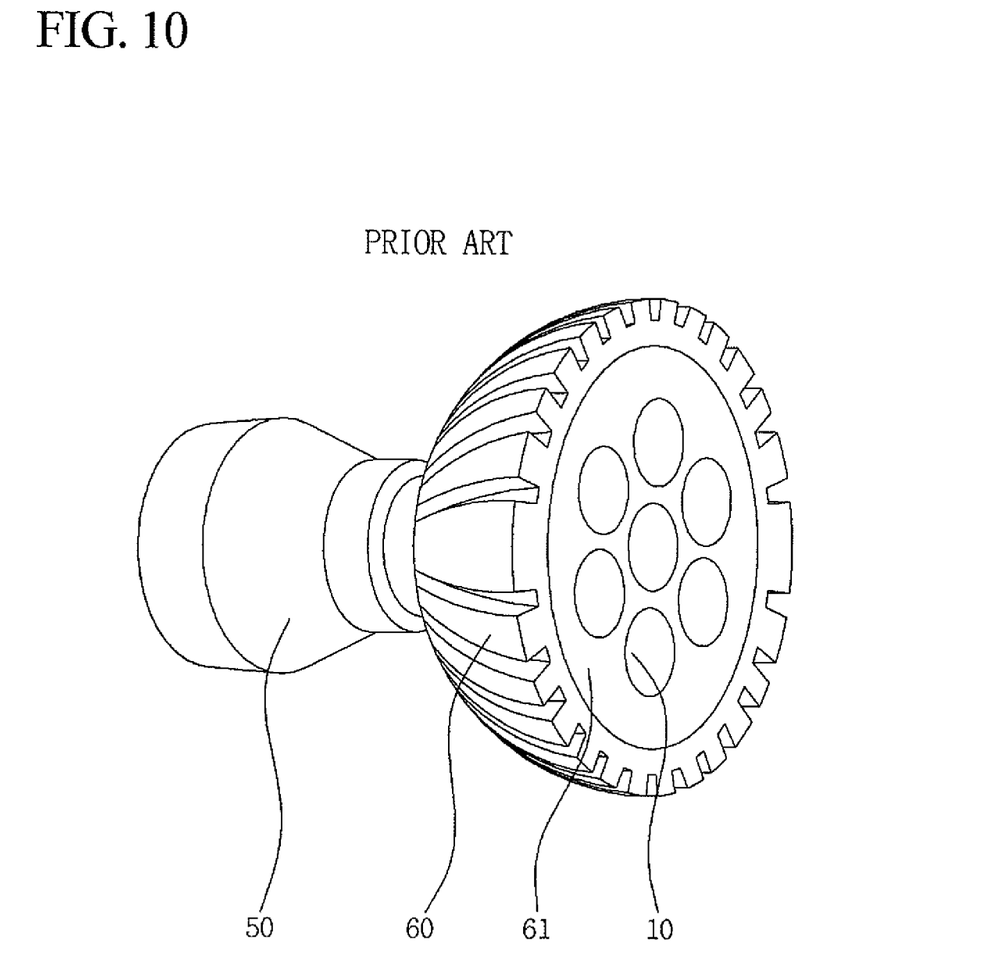
FIG. 10 is a perspective view showing an example of a conventional LED lighting device employing LED lenses.

FIG. 10 shows a photograph of an example of a conventional LED lighting device 60 employing a plurality of conventional LED lenses 4c. In the shown example, in a socket 50, the LED lighting device 60 is mounted. The plurality of LED lenses 4c, although not shown, are placed on a plurality of LED chips mounted on a substrate within the LED lighting device 60, respectively, and then are simply held and fixed by a front-side fixing plate without an additional adhesive.

Figure 11:
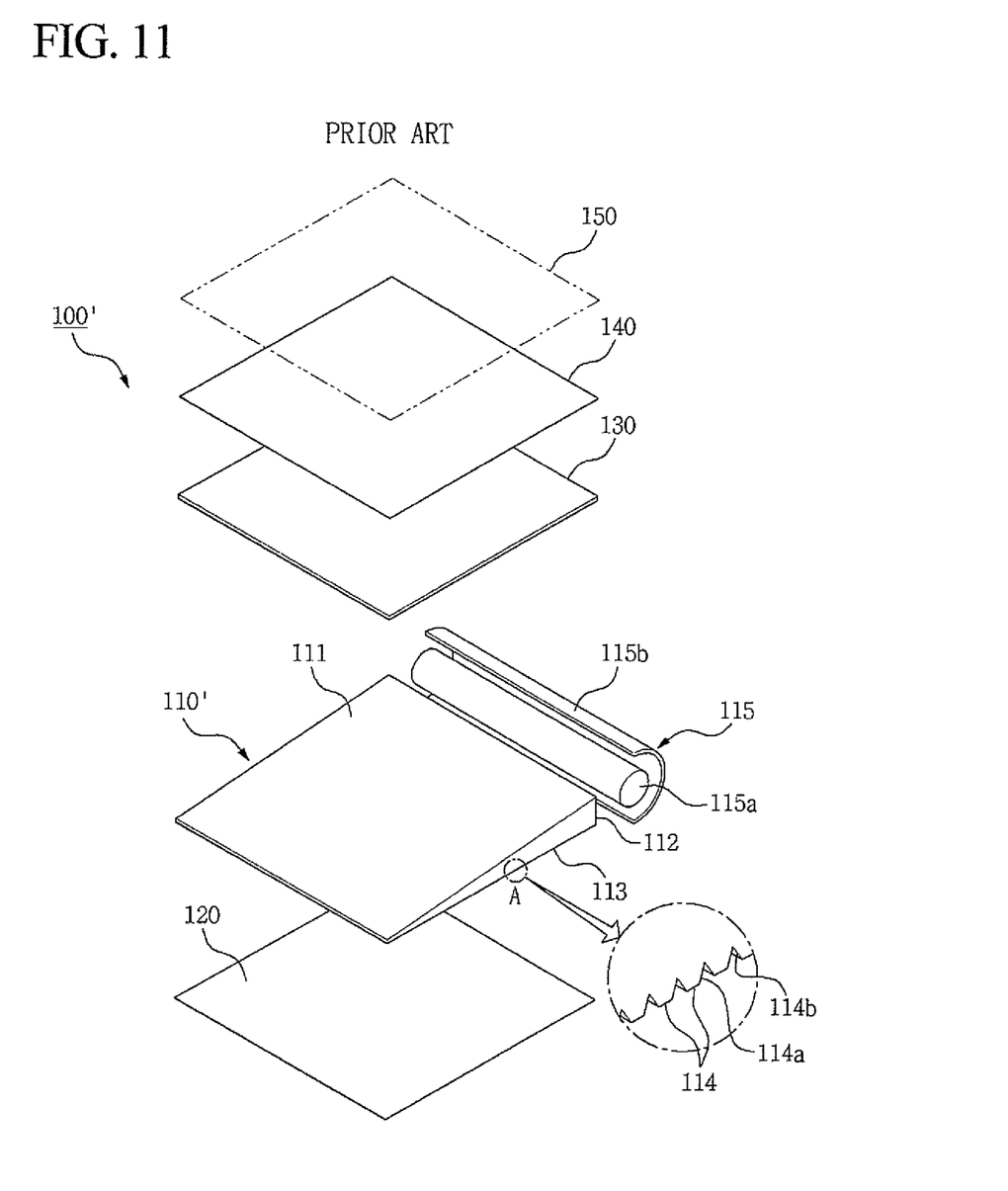
FIG. 11 is an exploded sectional view showing a schematic structure of a conventional edge type back light unit.

FIG. 11 is an exploded sectional view showing a schematic structure of a conventional edge type back light unit.

As shown in FIG. 11, the conventional edge type back light unit 100' includes a light source 115; a light guide plate 110' having an one end portion opposed to the light source 115a, a reflection sheet located at a lower surface of the light guide plate 110', a prismatic sheet 130 located at an upper surface of the light guide plate 110', a light diffusing sheet 140 located at an upper surface of the prismatic sheet 130, and a protective sheet 150 located at an upper surface of the light diffusing sheet 140.

More concretely, the light source 115 consists a linear light source 115a or a white LED (not shown). Also, the light source 115 having a reflection plate 115b is opposed to a thick side surface of the light guide plate 110' of a taper-shape. The reflection sheet 120 is located at the lower surface of the light guide plate 110' and the light diffusing sheet 140 and the protective sheet 150 are laminated the upper surface of the light guide plate 110' in order. The prismatic sheet 130 has a plurality of prismatic patterns (not shown) parallel to each other.

Also, a light emitting surface 111 is formed on the upper surface of the light guide plate 110' and the reflection sheet 112 is bounded on the lower surface of the light guide plate 110'. Furthermore, a flat incident surface 112 is formed on one side surface adjacent to the light source 115. Also, a plurality of prismatic patterns 114 having prismatic slopes 114a and 114b are formed on the lower surface of the light guide plate 110'.

Here, the light irradiated by the light source 115 is accepted into the flat incident surface 112 and then, is scattered by the prismatic slopes 114a and 114b of the prismatic patterns 114 located on the lower surface 113 of the light guide plate 110'. Thereafter, it is emitted toward the prismatic sheet 130 through the light emitting surface 111 of the light guide plate 110' and then, is again scattered by the prismatic sheet 130 having the plurality of parallel prismatic patterns (not shown) perpendicular to the prismatic patterns, which is located on the lower surface 113 of the light guide plate 110'. Finally, the light is converted into a homogenized light through the light diffusing sheet 140 to be outputted.

However, since the light diffusing sheet 140 serves to convert the incident light into the homogenized light over the entire area of the display panel through the diffusion and scattering thereof, in the conventional back light unit, there are problems in that the thickness thereof is increased and durability and economic feasibility thereof is deteriorated owing to increase of man-hour and number of parts.

SUMMARY OF THE INVENTION

Accordingly, the present invention has been made to solve the above-mentioned problems occurring in the prior art. A first object of the present invention is to epochally increase the life of an LED lighting device for white light emission, in which a long-life high-luminance LED (service life of about 100,000 hours), such as a blue LED, a violet LED, optionally a UV LED, instead of a conventional relatively short-life high-luminance white LED (service life of about 30,000 hours), is used to simply and easily obtain a white light or a yellowish white light for lighting.

Another object of the present invention is to allow a user or an operator, instead of a manufacturer, to directly and easily adjust a white light to a required intensity at a low cost, or obtain a mild white light by using a relatively inexpensive LED, such as a blue LED, a violet LED, or a UV LED, instead of a conventional expensive high-luminance white LED.

Further another object of the present invention is to effectively and easily remove a concern about non-uniformity in an emitted color, caused by non-uniform distribution or coating of a lighting color converting fluorescent substance.

Further another object of the present invention is to obtain a milder lighting with improved comfort by effectively reducing glare caused by a high-luminance white LED lighting.

Further another object of the present invention is to reduce a concern about deterioration of a lighting device, by high heat-resistance.

Further another object of the present invention is to provide a back light unit having a slim, a simple, and a good durable structure by using a color converting light guide plate for back light unit.

In order to achieve the objects mentioned above, there is provided a LED light converting resin composition comprising: 20~99 wt % of one kind of transparent resin selected from the group including a silicon, a polymethyl pentene, a polyether sulfon, a polyether imide, a polyarylate, a polymethyl methacylate, an urethane acrylate, an epoxy acrylate, a polyester acrylate, and an acryl acrylate; 0.8~60 wt % of a lighting color converting fluorescent substance; and 0.2~20 wt % of a light diffusing bead with an average particle diameter of 0.2~30 μm.

Preferably, the lighting color converting fluorescent substance comprises a YAG-based $(YGd)_3Al_5O_{12}$:Ce or $Sr_2Ga_2S_5$:$Eu_2^+$ yellow fluorescent substance to convert a blue LED into a white LED.

Preferably, the lighting color converting fluorescent substance comprises a red fluorescent substance and a green fluorescent substance to convert a blue LED into a white LED, wherein the red fluorescent substance is selected from the group including $Y_2O_2S$:Eu,Gd, $Li_2TiO_3$:Mn, $LiAlO_2$:Mn, $6MgO° As_2O_5$:$Mn_4^+$, and $3.5MgO° 0.5MgF_2° GeO_2$:$Mn_4^+$, and the green fluorescent substance is selected from the group including ZnS:Cu,Al, $Ca_2MgSi_2O_7$:Cl, $Y_3(Ga_xAl_{1-x})_5O_{12}$:Ce (0<x<1), $La_2O_3° 11Al_2O_3$:Mn, and $Ca_8Mg(SiO_4)_4Cl_2$:Eu, Mn.

Preferably, a weight ratio of the red fluorescent substance and the green fluorescent substance is 1:0.2~1.2.

Preferably, the lighting color converting fluorescent substance comprises a red fluorescent substance, a green fluorescent substance, and a blue fluorescent substance to convert a violet LED or a UV LED into a white LED, wherein the red fluorescent substance is selected from the group including $Y_2O_2S$:Eu,Gd, $Li_2TiO_3$:Mn, $LiAlO_2$:Mn, $6MgO° As_2O_5$:$Mn_4^+$, and $3.5MgO° 0.5MgF_2° GeO_2$:$Mn_4^+$, the green fluorescent substance is selected from the group including ZnS:Cu,Al, $Ca_2MgSi_2O_7$:Cl, $Y_3(Ga_xAl_{1-x})_5O_{12}$:Ce(0<x<1), $La_2O_3° 11Al_2O_3$:Mn, and $Ca_8Mg(SiO_4)_4Cl_2$:Eu, Mn, and the blue fluorescent substance is selected from the group including $BaMgAl_{10}O_{17}$ and $(Sr,Ca,BaMg)_{10}(PO_4)_6Cl_2$:Eu.

Preferably, a weight ratio of the red fluorescent substance, the blue fluorescent substance, and the green fluorescent substance is 1:0.2~1.2:0.2~1.2.

Preferably, the light diffusing bead is light diffusers having an average particle diameter of 1~4 μm:5~10 μm:11~30 μm mixed in a ratio of 1:0.4~0.8:0.1~0.3 by weight.

Preferably, the light diffusing bead is selected from the group including a silicon resin (refractive index: 1.43), polyacrylate (1.49), polyurethane (1.51), polyethylene (1.54), polypropylene (1.46), Nylon (1.54), polystyrene (1.59), polymethylmethacrylate (1.49), polycarbonate (1.59), silica (1.47), alumina (1.50~1.56), glass (1.51), $CaCO_3$ (1.51), talc (1.56), mica (1.56), $BaSO_4$ (1.63), ZnO (2.03), $CeO_2$ (2.15), $TiO_2$ (2.50~2.71), iron oxide (2.90), or suitable mixtures thereof, and when the light diffusing bead is a resin, the light diffusing bead is different from the heat-resistant transparent matrix resin.

Preferably, the transparent resin is silicon, and the light diffusing bead is polymethylmethacrylate.

Preferably, the LED light converting resin composition as claimed in claim 1, further comprising 0.1~3.0 wt % of a pigment.

Preferably, the transparent resin is an UV-curing resin of at least one kind selected from the group including an urethane acrylate, an epoxy acrylate, a polyester acrylate, and an acryl acrylate.

In order to achieve the objects mentioned above, there is provided an LED lens formed with an LED mounting portion, wherein the LED mounting portion is mounted with a molded article, a film, a sheet, or an UV-curing coating layer at an upper portion thereof, and the molded article, the film, the sheet, or the UV-curing coating layer comprises the LED light converting resin composition as described above.

Preferably, the molded article, the film, the sheet, or the UV-curing coating layer comprising the LED light converting resin composition is formed with a dichroic filter at the bottom thereof.

In order to achieve the objects mentioned above, there is provided an LED lens cluster comprising the LED lens as described above.

In order to achieve the objects mentioned above, there is provided a light guide plate for back light unit, wherein an UV-curing coating layer made by the LED light converting resin composition is formed at an incident surface or a light emitting surface, or incident and light emitting surfaces of the light guide plate.

In the LED light converting resin composition and the LED lens using the same, according to the present invention, it is possible to emit a white or yellowish white light, like a conventional white light LED, only by independently using a white light emitting LED lens with no change in a blue, violet, or UV LED. There is no need to use a white LED which is relatively expensive and has a short life. Instead, as required, in a conventional blue, violet, or UV LED having a long life (about three times the life of the white LED), it is possible to obtain a white light by simply and easily replacing a lens. Accordingly, it is possible to easily replace a conventional LED lens with an LED lens according to the present invention by a user or an operator, instead of a manufacturer, thereby obtaining a mild white light with a required luminance. Thus, glaring, caused by a high-luminance white LED lighting, can be effectively reduced, thereby providing a milder lighting with improved comfort. Furthermore, the concern about the deterioration of a lighting device can be reduced due to a high heat-resistance, which increases economical efficiency.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE EXEMPLARY EMBODIMENTS

Hereinafter, the present invention will be described in more detail.

First, there is no limitation in a matrix resin that may be used in the present invention as long as it has a good transparency and a good heat resistance. Preferably, the matrix resin has a high transparency and a high heat resistance. Examples of a transparent matrix resin having a preferable heat resistance may include a silicon resin, a polymethyl pentene resin, a polyether sulfon resin, a polyether imide resin, a polyarylate resin, or a polymethyl methacylate resin; or an UV-curing resin such as an urethane acrylate, an epoxy acrylate, a polyester acrylate, or an acryl acrylate. The addition amount of the matrix resin ranges from 22 to 99 wt %, preferably ranges from 60 to 98.7 wt %, and specifically from 82 to 97 wt % with respect to total weight of the composition.

Here, the amount of the matrix resin other than the UV-curing resin ranges from 50 to 99 wt %, preferably ranges from 20 to 99 wt %.

When the heat-resistance transparent matrix resin is included in an amount of less than 20 wt % with respect to the total weight of the composition, the transparency is reduced, and the luminance may be significantly reduced due to a back-lighting effect caused by scattering. On the other hand, when the heat-resistance transparent matrix resin is included in an amount greater than 99 wt %, a lighting color conversion effect may be insufficient, or a reducing extent of a glaring effect due to a high luminance may be insufficient.

All of the resins as mentioned above are known as heat-resistant transparent resins in the art, and thus explanation on them are omitted.

Meanwhile, in the present invention, as a fluorescent substance 3c and 4c for converting a lighting color into a white light, only a YAG-based yellow fluorescent substance known in the art may be used when a blue LED is used. Preferably, a green fluorescent substance and a red fluorescent substance may be used because they can provide a three-wavelength natural white light. Also, when a violet LED or a UV LED is used, a green fluorescent substance, a red fluorescent substance, and a blue fluorescent substance may be preferably used.

A typical example of a white LED obtained by using a blue LED and a YAG yellow fluorescent substance is $(YGd)_3Al_5O_{12}:Ce$ developed by Nichia corp. The YAG yellow fluorescent substance is excited at 550~560 nm.

Meanwhile, when the blue LED (a wavelength range of 425 nm~475 nm) with the green fluorescent substance, the red fluorescent substance, and the blue fluorescent substance are used, the examples of the red fluorescent substance capable of being excited in a wavelength range of 430 nm~480 nm may include $Y_2O_2S:Eu,Gd$, $Li_2TiO_3:Mn$, $LiAlO_2:Mn$, $6MgO° As_2O_5:Mn_4^+$, or $3.5MgO° 0.5MgF_2° GeO_2:Mn_4^+$, and also the examples of the green fluorescent substance capable of being excited in a wavelength range of 515 nm~520 nm may include $ZnS:Cu,Al$, $Ca_2MgSi_2O_7:Cl$, $Y_3(Ga_xAl_{1-x})_5O_{12}:Ce(0<x<1)$, $La_2O_3° 11Al_2O_3:Mn$, $Ca_8Mg(SiO_4)_4Cl_2:Eu, Mn$. However, the present invention is not limited thereto, and various substances known in the art may be used.

A three-wavelength white LED employing a blue LED, and red and green fluorescent substances emits a three-wavelength white light by generating a red light and a green light to be mixed with a blue light of the blue LED chip through excitation of a mixture of red and green fluorescent substances.

Also, the red and green fluorescent substances capable of being excited by the blue LED chip are oxides, and have a high stability and a prolonged life.

In the present invention, a three-wavelength white light is not obtained by directly/indirectly coating an appropriate-ratio mixture of the red and green fluorescent substances on the blue LED chip. Instead, it is noted that the three-wavelength white light is obtained through double-injection molding or attachment of a film or a sheet on a lens, as an additional member, attached to the LED.

The red fluorescent substance from among the red and green fluorescent substances is preferably $Li_2TiO_3:Mn$ at a light emission peak wavelength of about 659 nm, $LiAlO_2:Mn$ at a light emission peak wavelength of about 670 nm, $6MgO.As_2O_5:Mn_4^+$ at a light emission peak wavelength of about 650 nm, and $3.5MgO.0.5MgF_2.GeO_2:Mn_4^+$ at a light emission peak wavelength of about 650 nm.

The green fluorescent substance from among the red and green fluorescent substances is preferably $La_2O_3.11Al_2O_3:Mn$ at a light emission peak wavelength of about 520 nm, $Y_3(GaAl_{1-x})_5O_{12}:Ce(0<x<1)$ at a light emission peak wavelength of about 516 nm, and $Ca_8Mg(SiO_4)_4Cl_2:Eu, Mn$ at a light emission peak wavelength of about 515 nm.

The red and green fluorescent substances may be mixed in various ratios, and may form a neutral colored LED (e.g., pink or blue/white). Meanwhile, the blue LED chip may contain InGaN, SiC, or ZnSe.

Meanwhile, the violet LED or the UV LED, may employ $BaMgAl_{10}O_{17}$ or $(Sr,Ca,BaMg)_{10}(PO_4)_6Cl_2:Eu$ as a blue fluorescent substance as well as the red and green fluorescent substances.

Through an appropriate combination of the red, blue, and green fluorescent substances, it is possible to obtain a white light or various colors of lights, or obtain various lights with different color temperatures.

Of course, the obtained white light can be appropriately adjusted in a range of 3200~7500K through an appropriate combination of the red, blue, and green fluorescent substances on demand of a user.

The red fluorescent substance, the blue fluorescent substance, the green fluorescent substance, or a mixture thereof is included in an amount of 0.8~60 wt %, and preferably of 0.8~30 wt %, with respect to total weight of the composition.

The blue LED may employ the red fluorescent substance and the green fluorescent substance in a weight ratio of 1:0.2~1.2, and preferably in a weight ratio of 1:0.3~0.8. The violet LED or the UV LED may employ the red fluorescent substance, the blue fluorescent substance, and the green fluorescent substance in a weight ratio of 1:0.2~1.2:0.2~1.2, and preferably in a weight ratio of 1:0.3~0.8:0.3~0.8.

When the fluorescent substance 3c and 4c is included in an amount of less than 0.8 wt %, with respect to the total weight of the composition, a satisfactory white light may be not obtained. On the other hand, if the fluorescent substance is included in an amount of greater than 60 wt %, the luminance may be significantly reduced.

Meanwhile, examples of a light diffuser 3b and 4b to be selectively employed in the present invention may include: organic-based light diffusers, such as homopolymers and copolymers of monomers, selected from the group including silicon resin (a refractive index: 1.43), polyacrylate (1.49), polyurethane (1.51), polyethylene 1.54), polypropylene (1.46), Nylon (1.54), polystyrene (1.59), polymethylmethacrylate (1.49), and polycarbonate (1.59); inorganic-based light diffusers, e.g., silica (1.47), alumina (1.50~1.56), glass (1.51), $CaCO_3$ (1.51), talc (1.56), mica (1.56), $BaSO_4$ (1.63), ZnO (2.03), $CeO_2$ (2.15), $TiO_2$ (2.50~2.71), iron oxide (2.90); or suitable mixtures thereof. Preferably, the light diffuser may be an organic-based light diffuser, and most preferably, the light diffuser may be polymethylmethacrylate from the standpoint of the high transparency. Also, it is necessary that the kind of the light diffuser is different from the matrix resin in order to secure a fluorescent substance's sufficient excitation by an intended appropriate light diffusion.

The light diffuser 3b and 4b has an average particle diameter of 0.2~30 μm, preferably of 0.5~5 μm, especially of 1.0~3.5 μm, and is included in an amount of 0.2~20 wt %, preferably of 0.5~10 wt %, and especially of 1.0~3.0 wt % with respect to total weight of the composition.

When the average particle diameter of the light diffuser 3b and 4b is less than 0.2 μm, the transparency or the light transmittance may be reduced. On the other hand, if the average particle diameter is greater than 30 μm, the excitation of the fluorescent substance may be insufficient or non-uniform.

When the light diffuser 3b and 4b is included in an amount of less than 0.2 wt % with respect to the composition, the excitation of the fluorescent substance may be insufficient or non-uniform. On the other hand, when the light diffuser is included in an amount of greater than 20 wt %, the transparency or the light transmittance may be reduced.

Especially, in order to obtain a homogenized white light through a LED light converting resin composition, a mixture, which includes the light diffusers having an average particle diameter of 1~4 μm:5~10 μm:11~30 μm mixed in a ratio of 1:0.4~0.8:0.1~0.3 by weight, may be used.

Also, sometimes, an inorganic or organic pigment may be used according to preference, such as a lighting color, and may be included in an amount of 0.1~3.0 wt %, and preferably of 0.1~1.0 wt %. From the standpoint of transparency, an organic pigment is preferred. As such a pigment, various kinds of pigments known in the art may be used, for example, a nitro pigment, an azo pigment, indanthrone pigment, a thioindigo pigment, a perylene pigment, a dioxazine pigment, a quinacridone pigment, a phthalocyanine pigment, a quinophthalone pigment, etc. For example, the examples of a yellow pigment for providing a warm feeling may include monoazo, diazo, naphthalazobenzene, cork tree, goldthread or a mixed pigment thereof. However, this pigment is merely optional in the present invention.

In the meantime, there is no limitation in a thickness of the LED light converting resin composition that may be used in the present invention. The thickness thereof other than the UV-curing coating type resin composition is 50~3500 μm, preferably 100~1500 μm. The thickness the UV-curing coating type resin composition is 1~250 μm, preferably 3~100 μm.

Hereinafter, the present invention will be described in more detail with reference to the drawings.

Figure 1:
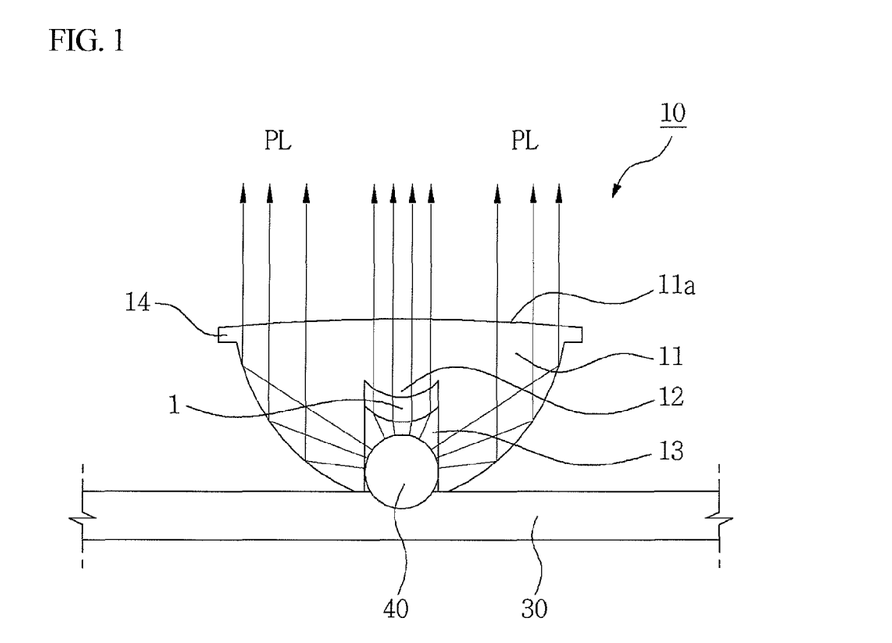
FIG. 1 is a cross-sectional view illustrating an LED lens using a LED light converting resin composition according to the present invention.

FIG. 1 is a cross-sectional view illustrating an LED lens using a LED light converting resin composition according to the present invention. The LED lens 10 according to the present invention is hemisphere-shaped with a wide upper part and a narrow lower part, and has an upper surface 11 formed with an annular lateral portion 11 and a flange 14, and a cylindrical LED mounting portion 13 formed at the bottom thereof, but the present invention is not limited thereto. In a conventional epoxy LED lens having a flat-shaped or internal convex portion 12 at the upper portion thereof, a double-injection molded LED light converting resin composition molded article 1 according to the present invention is attached to the flat-shaped portion or the internal convex portion 12 at the upper portion of the LED mounting portion 13. Thus, it is possible to simply and easily carry out the conversion of the emitted color by only inserting an appropriate LED lens 10 according to the present invention with no relation to a predetermined color such as a blue LED, a violet LED, a UV LED, and a white LED.

Also, the LED lens 10 according to the present invention may have a pectination upper surface for making an emitted light to be mild, a multiple-dot type upper surface, or a slippery smooth upper surface. Furthermore, as required, the upper surface may have an opening at the center thereof, and may be formed into a forward-projecting convex shape, a flat shape, a concave shape, or a specific another shape.

Figure 2:
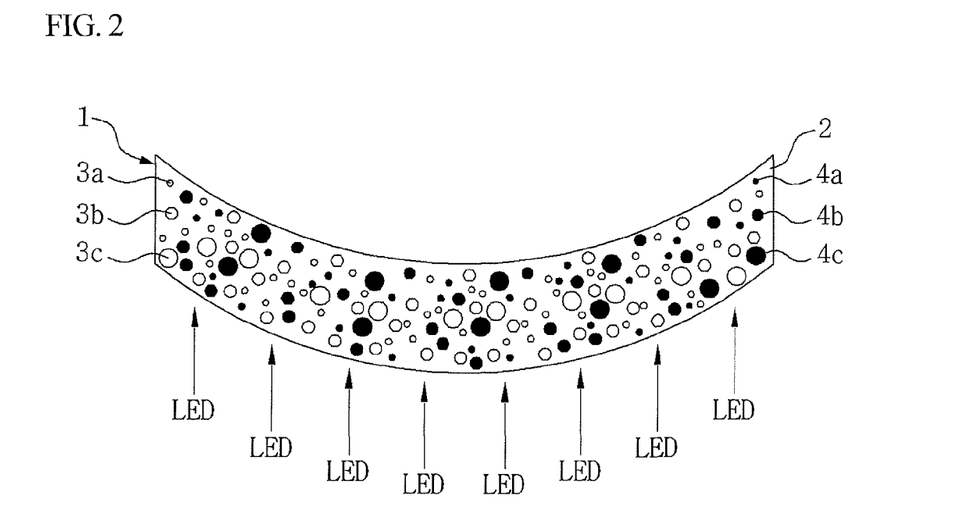
FIG. 2 is an enlarged mimetic diagram illustrating a LED light converting resin composition sheet or film applied to FIG. 1.

FIG. 2 is an enlarged mimetic diagram illustrating the LED light converting resin composition molded article 1 (sheet or film) for converting an emitted color into a white light, which is applied to FIG. 1, in which a fluorescent substance 3c and/or 4c, a light diffuser (bead) 3b and/or 4b, and a pigment 3a and/or 4a are homogeneously dispersed in a matrix resin 2.

As can be seen from FIG. 2, the LED light converting resin composition molded article can be independently applied to the LED lens 10 without relation to the light-emitting LED, and thus can simply and inexpensively convert the emitted color of the LED into white or yellowish white from a blue, violet, or UV LED. Furthermore, scattering caused by the light diffuser (bead) 3b and/or 4b allows the fluorescent substance 3c and/or 4c to sufficiently carry out the conversion of emitted color. Thus, there is no problem in a strictly homogeneous distribution of the fluorescent substance. Also, this can significantly reduce or lower an eye's stinging or fatigue caused by a high luminance of an LED when a user directly views a light source.

Figure 3:
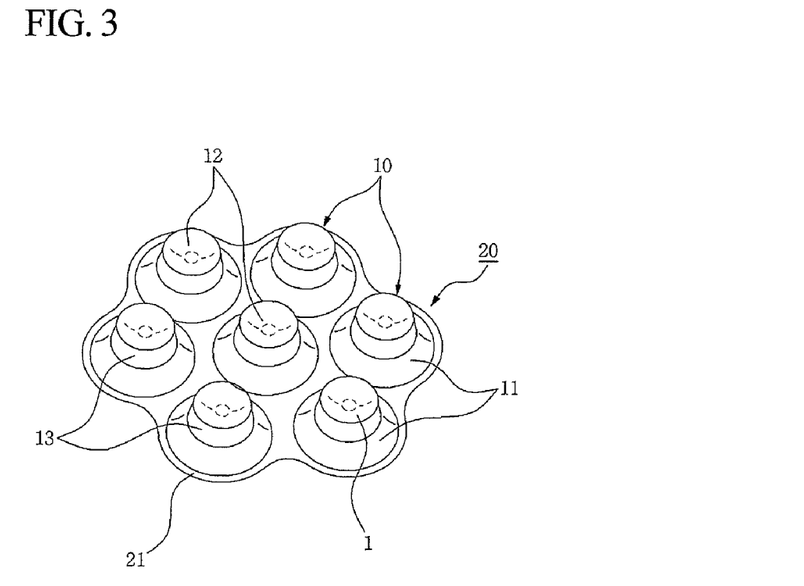
FIG. 3 is a perspective view showing a cluster of LED lenses shown in FIG. 1.

Meanwhile, FIG. 3 is a perspective view showing a cluster 20 of LED lenses 10 shown in FIG. 1. When the LED lenses 10 formed with the double-injection molded resin composition molded article 1 according to the present invention are formed in a cluster 20 according to the number, position, and arrangement of LEDs in an LED lighting device 60 as shown in FIG. 10, it is possible to more conveniently lessen the light intensity of the LED lighting device 60 or carry out conversion of an emitted color.

Also, as required, although not shown, a dichroic filter with a refractive index of 1.4~1.6 may be positioned at the bottom of the LED light converting resin composition molded article, which can transmit a light having a wavelength of equal to or less than 500 nm, and reflect a light having a wavelength of greater than 500 nm. The dichroic filter forms a dielectric layer, such as neodymium or holmium, on the upper surface at the fluorescent substance side, and thereby reduces damage to an LED device which may be caused by the backscattering of light due to the fluorescent substance. This may contribute to stabilization of a light emitting module, thereby increasing the life of the LED device.

Figure 4:
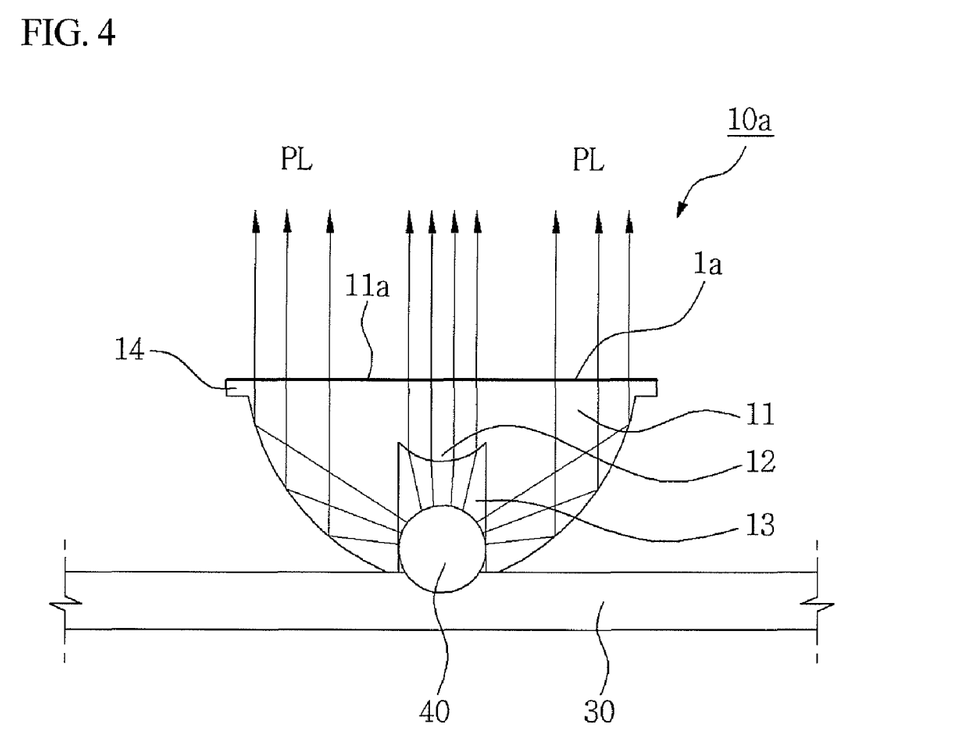
FIG. 4 is a cross-sectional view illustrating another LED lens using a LED light converting resin composition according to another embodiment of the present invention.

FIG. 4 is a cross-sectional view illustrating another LED lens using a LED light converting resin composition according to another embodiment of the present invention. Here, the LED light converting resin composition is coated on a flat upper surface 11a of a lens 10a as a UV-curing coating layer 1a. However, the present invention is not limited thereto, and where a LED lens of a convex shape (not shown) has a flat lower surface, the LED light converting resin composition can be coated on a flat lower surface.

Other matters are essentially the same as those of FIG. 1, and thus explanations on them are omitted.

Figure 5:
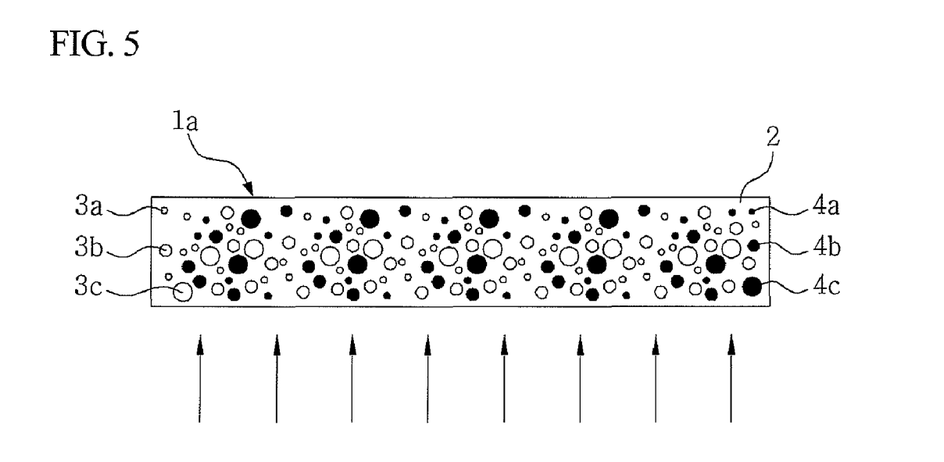
FIG. 5 is an enlarged mimetic diagram illustrating an a UV-curing coating layer applied to FIG. 4.

FIG. 5 is an enlarged mimetic diagram illustrating an UV-curing coating layer 1a applied to a LED lens 10a of FIG. 4. The LED light converting resin composition molded article 1a is essentially the same as that of FIG. 1, and thus explanations on them are omitted.

In the LED lens having a LED light converting resin composition molded article or the UV-curing coating layer 1a according to the present invention, it is possible to emit a white or yellowish white light, like a conventional white light LED, only by independently using a white light emitting LED lens or a light guide plate with no change in a blue, violet, or UV LED. There is no need to use a white LED which is relatively expensive and has a short life. Instead, as required, in a conventional blue, violet, or UV LED having a long life (about three times the life of the white LED), it is possible to obtain a white light by simply and easily replacing a lens. Accordingly, it is possible to easily replace a conventional LED lens with an LED lens according to the present invention by a user or an operator, instead of a manufacturer, thereby obtaining a mild white light with a required luminance. Thus, glaring, caused by a high-luminance white LED lighting, can be effectively reduced, thereby providing a milder lighting with improved comfort. Furthermore, it can provide a back light unit having a slim and simple structure, thereby increasing economical efficiency.

Figure 6:
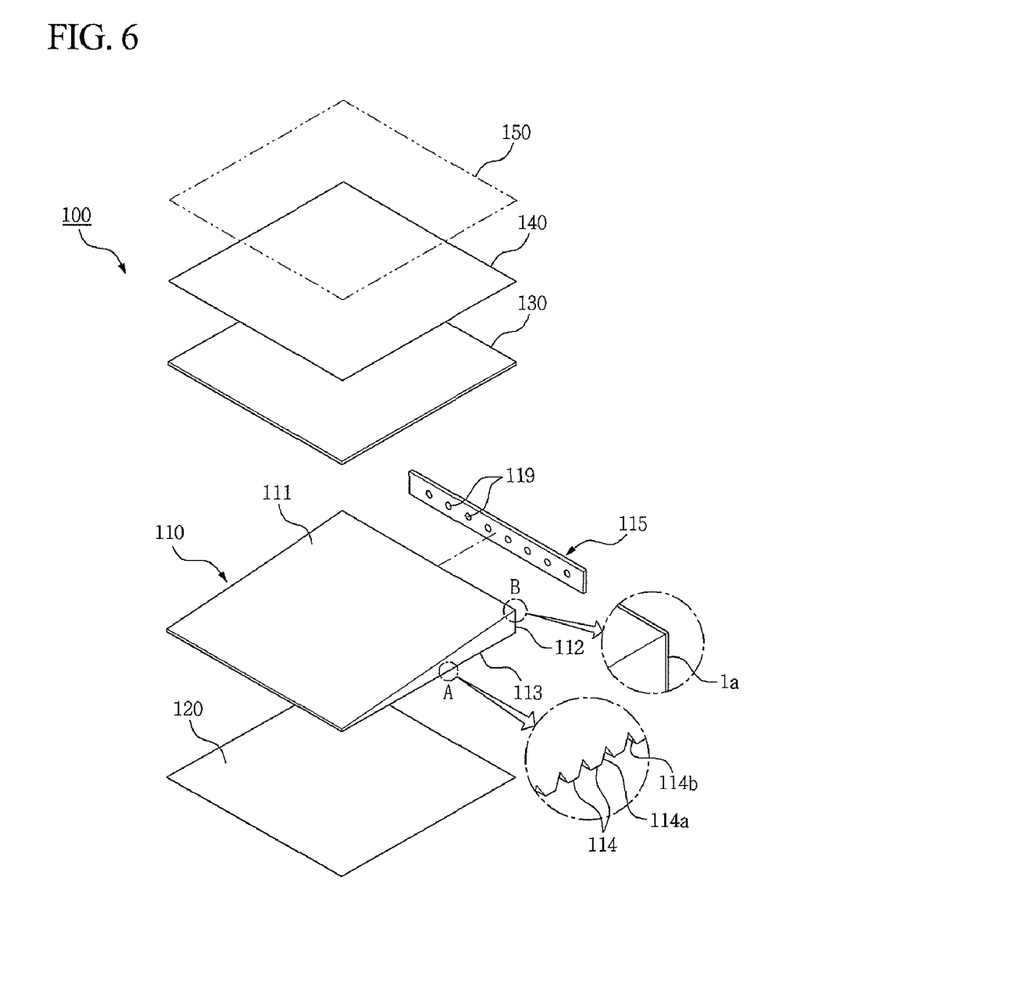
FIG. 6 is an exploded sectional view showing a schematic structure of a back light unit using a light guide plate having a coated LED light converting resin composition according to the present invention.

FIG. 6 is an exploded sectional view showing a schematic structure of a back light unit using a light guide plate 110 having a coated LED light converting resin composition according to the present invention. That is, FIG. 6 shows a schematic structure of a back light unit 100 using a light guide plate 110 in that a UV-curing coating layer 1a is applied to an incident surface 112 thereof through a LED light converting resin composition (see an enlarge portion "B") according to the present invention.

As shown in FIG. 6, the back light unit 100 includes a light source portion 115 having a plurality of light sources 119, which consists of any one of a blue LED, a purple LED, and an UV LED; a light guide plate 110 having an incident surface 112 opposed to the light source portion 115; a reflection sheet located at a lower surface of the light guide plate 110; and a prismatic sheet 130, a light diffusing sheet 140, and a protective sheet 150 gradually laminated on an upper surface of the light guide plate 110 having a light emitting surface 111.

Also, as shown in an enlarged portion "A" of FIG. 6, prismatic patterns 114 having prismatic slopes 114a and 114b are formed on a lower surface of the light guide plate 110.

Figure 7:
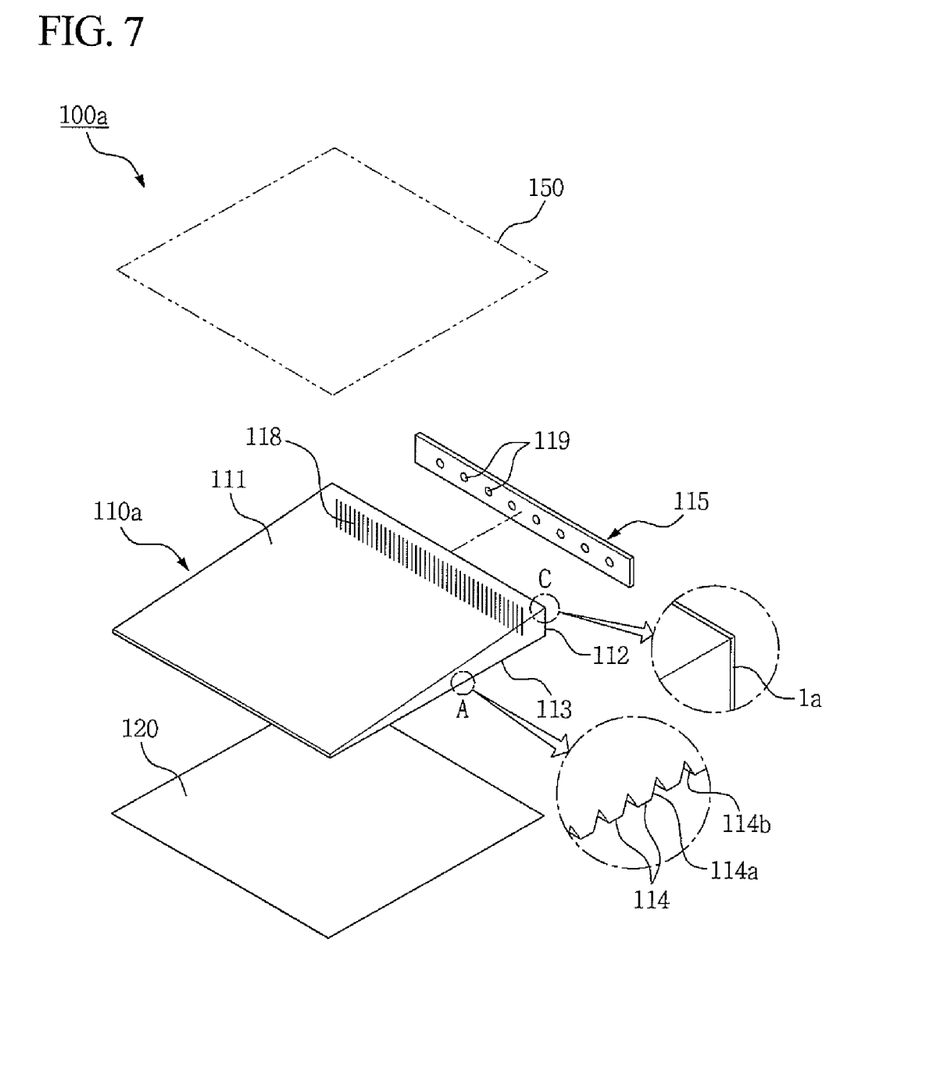
FIG. 7 is an exploded sectional view showing a schematic structure of a back light unit using another light guide plate having a coated LED light converting resin composition according to the present invention.

FIG. 7 is an exploded sectional view showing a schematic structure of a back light unit using another light guide plate having a coated LED light converting resin composition according to the present invention. That is, FIG. 7 shows a schematic structure of a back light unit 100a using a light guide plate 110a in that a UV-curing coating layer 1a is applied to an incident surface 112 thereof through a LED light converting resin composition (see an enlarge portion "C") and a plurality of internally prismatic patterns 118 of a slit shape is vertically parallel to and separated from each other at the inside portion of the light guide plate 110, which is located in the vicinity of the incident surface 112, by means of a laser process. As shown in FIG. 7, the back light unit 100a includes a light source portion 115 having a plurality of light sources 119, which consists of any one of a blue LED, a purple LED, and an UV LED; a light guide plate 110a including an incident surface 112 opposed to the light source portion 115 and having a color-converting resin layer 1a, a reflection sheet 120 located at a lower surface of the light guide plate 110a; and only a protective sheet 150 located on an upper surface of the light guide plate 110a having a light emitting surface 111. Otherwise, the back light unit 100a of FIG. 7 is actually the same as that of FIG. 6.

Therefore, in the back light units 100 and 100a using the UV-curing coating layer 1a made of the LED light converting resin composition according to the present invention shown in FIG. 6 and FIG. 7, there is no need to use a white LED which is relatively expensive and has a short life. Instead, it is possible to be simply and easily converted to a white light by using a relatively inexpensive LED having a long life, such as a blue LED, a violet LED, or a UV LED and the UV-curing coating layer 1a made of the LED light converting resin composition, thereby maintaining a long-life and increasing economical efficiency.

Also, the prismatic sheet 130, the light diffusing sheet 140, and the protective sheet 150 are all shown in FIG. 6. However, although not shown, where the UV-curing coating layer 1a made of the LED light converting resin composition is coated on the light emitting surface 111, the UV-curing coating layer 1a itself can serve to perform the functions of the light diffusing sheet 140 and the protective sheet 150 through the diffuser 3b and 4b. Furthermore, the prismatic sheet 130 is not essential construction in the back light unit 100. Accordingly, the above elements can be omitted at the same time. As required, in a state that the prismatic sheet 130 is attached thereto, the UV-curing coating layer 1a having the light diffuser 3b and 4b is coated on the light emitting surface 111, so that it can implement a back light unit having slim and simple structure, thereby giving good durability and economic feasibility owing to reduction of man-hour and number of parts.

Also, as shown in FIG. 7, the plurality of internally prismatic patterns 118 of a slit shape is vertically parallel to and separated from each other at the inside portion of the light guide plate 110a, which is located in the vicinity of the incident surface 112, by irradiating a laser beam generated from a well-known laser oscillator in focus, so that the light emitted from the light sources 119 is thinly and uniformly dispersed in the transverse direction perpendicular to the light sources 119 through the prismatic patterns 119 and a surface light source of a uniform luminance is shown on the light emitting surface 111 through the prismatic patterns 114, which is located on the lower surface of the light guide plate 110a As shown, since the plurality of internally prismatic patterns 118 is existed in the inside of the light guide plate 110a, the incident surface 112 has a flat surface. Accordingly, the LED light converting UV-curing coating layer 1a is smoothly formed with a uniform dispersion of the fluorescent substance, thereby easily performing the working thereof.

The material of the light guide plate 110 and 110a is a well-known transparent resin of heat-resisting property, a crystal, or a glass and so on such as a acryl, a polycarbonate, polymethyl methacylate and so forth.

Also, as shown in FIG. 7, by applying the back light unit 100a using the LED light converting light guide plate 110a in that the LED light converting UV-curing coating layer 1a is applied to the flat incident surface 112, the internally prismatic patterns 118 are formed at the inside portion of the light guide plate 110, which is located in the vicinity of the incident surface 112, and the prismatic patterns 114 are formed at the lower surface 113 of the light guide plate 110a, only the protective sheet 150 is laminated on the light emitting surface 111, thereby giving the back light unit 100a having thin and simple structure. However, there is limited to this structure. Although not shown, another UV-curing coating layer 1a having the above-mentioned light diffuser instead of the protective sheet 150 is coated on the light emitting surface 111, so that it serves as the diffusing and protective sheets. Thus, it can implement a groundbreaking back light unit having slim and simple structure, thereby giving good durability and economic feasibility owing to reduction of man-hour and number of parts.

Where the LED light converting resin composition is used as the UV-curing coating layer 1a, there is no limitation in a kind of an available photoinitiator. The photoinitiator is an alpha-hydroxy ketone, a phenyl glyoxylate, alpha-amino ketone, butyl Dihydroxy ketone, acyl phosphine oxide, etc., which is widely used in an UV-curing hard coating. Preferably, the photoinitiator is an alpha-hydroxy ketone or a phenyl glyoxylate in terms of a light translucency. The addition amount of the photoinitiator ranges from 0.1 to 8 wt %, and more generally ranges from 0.1 to 4 wt %, with respect to total weight of the UV-curing resin.

As mentioned on the curing condition, by using a mercury lamp or xenon of exposed dose 700~1300 mJ, generally exposed dose 700~1000 mJ with a wavelength of 350 nm~400 nm, the UV hard coating layer is cured for about 1~60 seconds, generally about 10~30 seconds.

Where the LED light converting UV-curing coating layer 1a is applied to the light guide plate 110 or 110a, especially the incident surface 112, it is economical owing to the reduction of the usage of the fluorescent substance. Also, since volatile organic compounds are not almost generated, it is eco-Environmental. Furthermore, the productivity thereof is higher than a heat-curing type and a film of paint has a high anti-scratch property. As required, antistatic agents or antifouling agents are added thereto, thereby easily preventing static electricity or pollution.

In the back light unit using the UV-curing coating layer made of the LED light converting resin composition according to the present invention, there is no need to use a white LED which is relatively expensive and has a short life. Instead, it is possible to be simply and easily converted to a white light by using a relatively inexpensive LED having a long life, such as a blue LED, a violet LED, or a UV LED and the UV-curing coating layer 1a made of the LED light converting resin composition, thereby maintaining a long-life and increasing economical efficiency. Selectively, since the prismatic sheet and/or the light diffusing sheet can be excluded, the structure thereof is very thin. Also, it can reduce a concern about deterioration of a lighting device, by high heat-resistance.

Hereinafter, the present invention will be described in more detail with reference to the Examples.

EXAMPLE 1

First, an LED lens cluster made of an epoxy resin, as shown in FIG. 3, was injection-molded. Then, a LED light converting resin composition for conversion of an emitted color, including 84 wt % of a silicon resin (Dow Corning Corp., 409 HS), 14 wt % of $(YGd)_3A_{15}O_{12}$:Ce as a yellow fluorescent substance, and 2 wt % of polymethylmethacrylate with an average particle diameter 2.0 μm (refractive index: 1.50, light transmittance: 91%) as a light diffuser, was double-injection molded with a thickness of 2 mm within the LED mounting portion. The molded article was integrally formed with the LED lens.

The LED lens cluster manufactured as described above was mounted to the LED lighting device provided with a blue LED, as shown in FIG. 5. As a result, a slightly yellowish white light was obtained.

EXAMPLE 2

An LED lens cluster was manufactured in the same manner as in Example 1, except that a LED light converting resin composition for emitted-color conversion, includes 84 wt % of a silicon resin (Dow Corning Corp., 409 HS), 13.8 wt % of $(YGd)_3A_{15}O_{12}$:Ce as a yellow fluorescent substance, 2 wt % of polymethylmethacrylate with an average particle diameter 2.0 μm as a light diffuser, and 0.2 wt % of naphthalazobenzene.

The LED lens cluster manufactured as described above was mounted to the LED lighting device provided with a blue LED, as shown in FIG. 5. As a result, a yellow light was obtained due to the addition of a pigment.

EXAMPLE 3

An LED lens cluster was manufactured in the same manner as in Example 1, except that a LED light converting resin composition includes 83 wt % of a polymethyl pentene resin (Mitsui Kagaku Co., Ltd., Japan, heat-resistance temperature: 200° C., MTS 284), 9 wt % of $Y_2O_2S$:Eu,Gd as a red fluorescent substance, 6 wt % of ZnS:Cu,Al as a green fluorescent substance, and 2 wt % of polymethylmethacrylate with an average particle diameter 2.0 μm as a light diffuser.

The LED lens cluster manufactured as described above was mounted to the LED lighting device provided with a blue LED, as shown in FIG. 5. As a result, a natural three-wavelength white light was obtained.

EXAMPLE 4

An LED lens cluster was manufactured in the same manner as in Example 1, except that a LED light converting resin composition includes 88 wt % of a polyether sulfon resin (ICI Co., Ltd., England, refractive index: 1.65, heat-resistance temperature: 200° C.), 5 wt % of $Li_2TiO_3$:Mn as a red fluorescent substance, 4 wt % of $Ca_2MgSi_2O_7$:Cl as a green fluorescent substance, and 3 wt % of polymethylmethacrylate with an average particle diameter 2.0 μm as a light diffuser.

The LED lens cluster manufactured as described above was mounted to the LED lighting device provided with a blue LED. As a result, a natural three-wavelength white light was obtained.

EXAMPLE 5

An LED lens cluster was manufactured in the same manner as in Example 1, except that a LED light converting resin composition includes 86 wt % of a polyether imide resin (GE Co., Ltd., U.S.A., refractive index: 1.558, heat-resistance temperature: 170° C.), 5 wt % of $LiAlO_2$:Mn as a red fluorescent substance, 4 wt % of $Y_3(Ga_xAl_{1-x})_5O_{12}$:Ce (0<x<1) as a green fluorescent substance, 3 wt % of $BaMgAl_{10}O_{17}$ as a blue fluorescent substance, and 2 wt % of polymethylmethacrylate with an average particle diameter 2.0 μm as a light diffuser.

The LED lens cluster manufactured as described above was mounted to the LED lighting device provided with a purple LED. As a result, a natural three-wavelength white light was obtained.

EXAMPLE 6

An LED lens cluster was manufactured in the same manner as in Example 1, except that a LED light converting resin composition includes 87 wt % of a polyarylate resin (Cab Random Co., Ltd., U.S.A., refractive index: 1.57, heat-resistance temperature: 260° C.), 4 wt % of $6MgO°\ As_2O_5:Mn_4^+$ as a red fluorescent substance, 2.8 wt % of $La_2O_3°\ 11Al_2O_3$:Mn as a green fluorescent substance, 2.5 wt % of $(Sr,Ca,BaMg)_{10}(PO_4)_6Cl_2$:Eu, and 3.7 wt % of polymethylmethacrylate with an average particle diameter 2.0 μm as a light diffuser.

The LED lens cluster manufactured as described above was mounted to the LED lighting device provided with an UV LED. As a result, a natural three-wavelength white light was obtained.

EXAMPLE 7

An LED lens cluster was manufactured in the same manner as in Example 1, except that a LED light converting resin composition includes 95 wt % of polymethylmethacrylate (Sunjin Chemical Co., Ltd., S-200, refractive index: 1.49. light transmittance: 91%), 2 wt % of $3.5MgO°\ 0.5MgF_2°\ GeO_2:Mn_4^+$ as a red fluorescent substance, 1 wt % of $Ca_8Mg(SiO_4)_4Cl_2$:Eu, Mn as a green fluorescent substance, 1 wt % of $BaMgAl_{10}O_{17}$ as a blue fluorescent substance, and 1 wt % of polycarbonate with an average particle diameter 3.0 μm (refractive index: 1.59) as a light diffuser.

The LED lens cluster manufactured as described above was mounted to the LED lighting device provided with a violet LED. As a result, a natural white light was obtained.

EXAMPLE 8

In each of the LED lenses in the LED lens cluster obtained from Example 7, dichroic filters (Hyosung Corp.) V-10 (neodymium coating) and HY-1 (holmium coating) were laid at the bottom of the light converting molded article, respectively.

The LED lens cluster manufactured as described above was mounted to the LED lighting device provided with a violet LED. As a result, the luminance was significantly increased to naked eye, as compared to that in Example 7.

EXAMPLE 9

First, an LED lens made of an epoxy resin shown in FIG. 4 was injection-molded. Then, a mixture which includes 62 wt % of epoxy acrylate monomer and oligomer (including 3.5 wt % of alpha-hydroxy ketone as a photoinitiator), 30 wt % of $(YGd)_3Al_5O_{12}$:Ce as a yellow fluorescent substance, and 8 wt % of polycarbonate with an average particle diameter 3.0 μm (refractive index: 1.59) as a light diffuser was applied to the upper surface of the LED lens, and was irradiated with a xenon lamp with a dose of 890 mJ for 30 seconds to form a UV-curing coating layer for LED light conversion, with a thickness of 58 μm.

The LED lens manufactured as described above was mounted to a blue LED. As a result, a slightly yellowish white light was obtained.

EXAMPLE 10

First, an LED lens made of an epoxy resin was injection-molded. Then, a mixture which includes 52 wt % of epoxy acrylate monomer and oligomer (including 3.5 wt % of alpha-hydroxy ketone as a photoinitiator), 40 wt % of $(YGd)_3Al_5O_{12}$:Ce as a yellow fluorescent substance, and 8 wt % of polymethylmethacrylate (refractive index: 1.50. light transmittance: 91%) with an average particle diameter 2.0 μm as a light diffuser was applied to the upper surface of the LED lens, and was irradiated with a xenon lamp with a dose of 890 mJ for 30 seconds to form a UV-curing coating layer for LED light conversion, with a thickness of 85 μm.

The LED lens manufactured as described above was mounted to a blue LED. As a result, a white light was obtained.

EXAMPLE 11

An UV-curing coating layer for LED light conversion was formed on a flat upper surface of the LED lens in the same manner as in Example 9, except that a mixture which includes 50 wt % of urethane acrylate monomer and oligomer (including 1.8 wt % of phenyl glyoxylate as a photoinitiator), 20 wt % of $Y_2O_2S$:Eu,Gd as a red fluorescent substance, 20 wt % of ZnS:Cu,Al as a green fluorescent substance, and 10 wt % of polymethylmethacrylate with an average particle diameter 2.0 μm as a light diffuser was applied to the flat upper surface of the epoxy LED lens The LED lens manufactured as described above was mounted to a blue LED. As a result, a white light was obtained.

EXAMPLE 12

An UV-curing coating layer for LED light conversion was formed on a flat upper surface of the LED lens in the same manner as in Example 9, except that a mixture which includes 52 wt % of acryl acrylate and oligomer (including 1.5 wt % of phenyl glyoxylate as a photoinitiator), 23 wt % of $LiAlO_2$:Mn as a red fluorescent substance, 12 wt % of $Y_3(Ga_xAl_{1-x})_5O_{12}$:Ce (0<x<1) as a green fluorescent substance, 10 wt % of $BaMgAl_{10}O_{17}$ as a blue fluorescent substance, and 3 wt % of polymethylmethacrylate with an average particle diameter 2.0 μm as a light diffuser was applied to the flat upper surface of the epoxy LED lens The LED lens manufactured as described above was mounted to a purple LED. As a result, a white light was obtained.

EXAMPLE 13

A mixture which includes 92 wt % of polyester acrylate monomer and oligomer (including 2.5 wt % of alpha-hydroxy ketone as a photoinitiator), 5 wt % of $Sr_2Ga_2S_5:Eu_2^+$ as a yellow fluorescent substance, and 3 wt % of polymethylmethacrylate with an average particle diameter 2.0 μm as a light diffuser was applied to an incident surface of a light guide plate shown in FIG. 6, and was irradiated with a xenon lamp with a dose of 1000 mJ for 20 seconds to form a UV-curing coating layer for LED light conversion, with a thickness of 96 μm.

When a backlight unit employing the color-converting light guide plate manufactured as described above, and a blue LED were used, it can be seen from the backlighting that a white light was obtained.

EXAMPLE 14

A mixture which includes 45 wt % of epoxy acrylate monomer and oligomer (including 3.5 wt % of alpha-hydroxy ketone as a photoinitiator), 20 wt % of $Li_2TiO_3$:Mn as a red fluorescent substance, 25 wt % of $Ca_2MgSi_2O_7$:Cl as a green fluorescent substance, and 10 wt % of polycarbonate (refractive index: 1.59) with an average particle diameter 3.0 μm as a light diffuser was applied to an incident surface of a light guide plate shown in FIG. 6, and was irradiated with a xenon lamp with a dose of 1000 mJ for 28 seconds to form a UV-curing coating layer for LED light conversion, with a thickness of 150 μm.

When a backlight unit employing the color-converting light guide plate manufactured as described above, and a blue LED were used, it can be seen from the backlighting that a white light was obtained.

EXAMPLE 15

A mixture which includes 44 wt % of epoxy acrylate monomer and oligomer (including 2.2 wt % of phenyl glyoxylate as a photoinitiator), 20 wt % of $LiAlO_2$:Mn as a red fluorescent substance, 16 wt % of $Y_3(Ga_xAl_{1-x})_5O_{12}$:Ce(0<x<1) as a green fluorescent substance, 15 wt % of $BaMgAl_{10}O_{17}$ as a blue fluorescent substance, and 5 wt % of polymethylmethacrylate with an average particle diameter 2.0 μm as a light diffuser was applied to an incident surface of a light guide plate shown in FIG. 7, and was irradiated with a xenon lamp with a dose of 1000 mJ for 25 seconds to form a UV-curing coating layer for LED light conversion, with a thickness of 100 μm.

When a backlight unit employing the color-converting light guide plate manufactured as described above, and a blue LED were used, it can be seen from the backlighting that a white light was obtained.

EXAMPLE 16

A mixture which includes 50 wt % of urethan acrylate monomer and oligomer (including 3.5 wt % of alpha-hydroxy ketone as a photoinitiator), 18 wt % of $LiAlO_2$:Mn as a red fluorescent substance, 15 wt % of $Y_3(Ga_xAl_{1-x})_5O_{12}$:Ce (0<x<1) as a green fluorescent substance, 12 wt % of $BaMgAl_{10}O_{17}$ as a blue fluorescent substance, and 5 wt % of polymethylmethacrylate with an average particle diameter 2.0 μm as a light diffuser was applied to an incident surface of a light guide plate shown in FIG. 7, and was irradiated with a xenon lamp with a dose of 1000 mJ for 25 seconds to form a UV-curing coating layer for LED light conversion, with a thickness of 120 μm.

When a backlight unit employing the color-converting light guide plate manufactured as described above, and a blue LED were used, it can be seen from the backlighting that a white light was obtained.

What is claimed is:

1. A LED light converting resin composition, comprising:
   20~99 wt % of one kind of transparent resin selected from the group consisting of a silicon, a polymethyl pentene, a polyether sulfon, a polyether imide, a polyarylate, a polymethyl methacylate, an urethane acrylate, an epoxy acrylate, a polyester acrylate, and an acryl acrylate;
   0.8~60 wt % of a lighting color converting fluorescent substance; and
   0.2~20 wt % of a light diffusing bead with an average particle diameter of 0.2~30 μm,
   wherein said light diffusing bead are light diffusers having an average particle diameter of 1~4 μm-:5~10 μm-:11~30 μm- mixed in a ratio of 1:0.4~0.8:0.1~0.3 by weight.

2. The LED light converting resin composition as claimed in claim 1, wherein the lighting color converting fluorescent substance comprises a YAG-based $(YGd)_3Al_5O_{12}$:Ce or $Sr_2Ga_2S_5$:$Eu_2^+$ yellow fluorescent substance to convert a blue LED into a white LED.

3. The LED light converting resin composition as claimed in claim 1, wherein the lighting color converting fluorescent substance comprises a red fluorescent substance and a green fluorescent substance to convert a blue LED into a white LED, wherein the red fluorescent substance is selected from the group including consisting of $Y_2O_2S$:Eu,Gd, $Li_2TiO_3$:Mn, $LiAlO_2$:Mn, $6MgO° As_2O_5$:$Mn_4^+$, and $3.5MgO° 0.5MgF_2° GeO_2$:$Mn_4^+$, and the green fluorescent substance is selected from the group consisting of ZnS:Cu,Al, $Ca_2MgSi_2O_7$:Cl, $Y_3(Ga_xAl_{1-x})_5O_{12}$:Ce(0<x<1), $La_2O_3° 11Al_2O_3$:Mn, and $Ca_8Mg(SiO_4)_4Cl_2$:Eu, Mn.

4. The LED light converting resin composition as claimed in claim 3, wherein a weight ratio of the red fluorescent substance and the green fluorescent substance is 1:0.2~1.2.

5. The LED light converting resin composition as claimed in claim 1, wherein the lighting color converting fluorescent substance comprises a red fluorescent substance, a green fluorescent substance, and a blue fluorescent substance to convert a violet LED or a UV LED into a white LED, wherein the red fluorescent substance is selected from the group consisting of $Y_2O_2S$:Eu,Gd, $Li_2TiO_3$:Mn, $LiAlO_2$:Mn, $6MgO° As_2O_5$:$Mn_4^+$, and $3.5MgO° 0.5MgF_2° GeO_2$:$Mn_4^+$, the green fluorescent substance is selected from the group consisting of ZnS:Cu,Al, $Ca_2MgSi_2O_7$:Cl, $Y_3(Ga_xAl_{1-x})_5O_5O_{12}$:Ce (0<x<1), $La_2O_3° 11Al_2O_3$:Mn, and $Ca_8Mg(SiO_4)_4Cl_2$:Eu, Mn, and the blue fluorescent substance is selected from the group consisting of $BaMgAl_{10}O_{17}$ and $(Sr,Ca,BaMg)_{10}(PO_4)_6 Cl_2$:Eu.

6. The LED light converting resin composition as claimed in claim 5, wherein a weight ratio of the red fluorescent substance, the blue fluorescent substance, and the green fluorescent substance is 1:0.2~1.2:0.2~1.2.

7. The LED light converting resin composition as claimed in claim 1, wherein the light diffusing bead is selected from the group consisting of a silicon resin (refractive index: 1.43), polyacrylate (1.49), polyurethane (1.51), polyethylene (1.54), polypropylene (1.46), Nylon (1.54), polystyrene (1.59), polymethylmethacrylate (1.49), polycarbonate (1.59), silica (1.47), alumina (1.50~1.56), glass (1.51), $CaCO_3$ (1.51), talc (1.56), mica (1.56), $BaSO_4$ (1.63), ZnO (2.03), $CeO_2$ (2.15), $TiO_2$ (2.50~2.71), iron oxide (2.90), and suitable mixtures thereof, and
   when the light diffusing bead is a resin, the light diffusing bead is different from a heat-resistant transparent matrix resin.

8. The LED light converting resin composition as claimed in claim 7, wherein the transparent resin is silicon, and the light diffusing bead is polymethylmethacrylate.

9. The LED light converting resin composition as claimed in claim 1, further comprising 0.1~3.0 wt % of a pigment.

10. The LED light converting resin composition as claimed in claim 1, wherein the transparent resin is an UV-curing resin of at least one kind selected from the group consisting of an urethane acrylate, an epoxy acrylate, a polyester acrylate, and an acryl acrylate.

11. An LED lens formed with an LED mounting portion, comprising:
an LED mounting portion is mounted with a member selected from the group consisting of a molded article, a film, a sheet, and a UV-curing coating layer at an upper portion thereof, and the member selected from the group consisting of the molded article, the film, the sheet, and the UV-curing coating layer comprises a LED light converting resin composition comprising 20~99 wt % of one kind of transparent resin selected from the group consisting of a silicon, a polymethyl pentene, a polyether sulfon, a polyether imide, a polyarylate, a polymethyl methacylate, an urethane acrylate, an epoxy acrylate, a polyester acrylate, and an acryl acrylate;
0.8~60 wt % of a lighting color converting fluorescent substance; and
0.2~20 wt % of a light diffusing bead with an average particle diameter of 0.2~30 µm,
wherein said light diffusing bead are light diffusers having an average particle diameter of 1~4 µm-:5~10 µm-:11~30 µm- mixed in a ratio of 1:0.4~0.8:0.1~0.3 by weight.

12. The LED lens as claimed in claim 11, wherein the member selected from the group consisting of the molded article, the film, the sheet, and the UV-curing coating layer comprising the LED light converting resin composition is formed with a dichroic filter at the bottom thereof.

13. An LED lens cluster comprising the LED lens as claimed in claim 11.

14. A light guide plate for back light unit, comprising:
a UV-curing coating layer made by the LED light converting resin composition comprising 20~99 wt % of one kind of transparent resin selected from the group consisting of a silicon, a polymethyl pentene, a polyether sulfon, a polyether imide, a polyarylate, a polymethyl methacylate, an urethane acrylate, an epoxy acrylate, a polyester acrylate, and an acryl acrylate;
0.8~60 wt % of a lighting color converting fluorescent substance; and
2~20 wt % of a light diffusing bead with an average particle diameter of 0.2~30 µm,
wherein said light diffusing bead are light diffusers having an average particle diameter of 1~4 µm-:5~10 µm-:11~30 µm- mixed in a ratio of 1:0.4~0.8:0.1~0.3 by weight,
and wherein said UV-curing coating layer is formed at a member selected from the group consisting of an incident surface, a light emitting surface, and an incident and light emitting surfaces of the light guide plate.

15. A back light unit comprising the light guide plate as claimed in claim 14.

* * * * *